United States Patent
Li et al.

(10) Patent No.: US 12,144,150 B2
(45) Date of Patent: Nov. 12, 2024

(54) HEAT DISSIPATING DEVICE

(71) Applicant: VAST GLORY ELECTRONIC & HARDWARE & PLASTIC (HUI ZHOU) LTD, Hui Zhou (CN)

(72) Inventors: Xiao-Yao Li, Hui Zhou (CN); Yu-Ka Feng, Hui Zhou (CN); Yuan-Long Wen, Hui Zhou (CN)

(73) Assignee: VAST GLORY ELECTRONIC & HARDWARE & PLASTIC (HUI ZHOU) LTD, Hui Zhou (CN)

(*) Notice: Subject to any disclaimer, the term of this patent is extended or adjusted under 35 U.S.C. 154(b) by 174 days.

(21) Appl. No.: 17/975,511

(22) Filed: Oct. 27, 2022

(65) Prior Publication Data
US 2024/0049428 A1 Feb. 8, 2024

(30) Foreign Application Priority Data
Aug. 2, 2022 (CN) .......................... 202210921448.1

(51) Int. Cl.
*H05K 7/20* (2006.01)
(52) U.S. Cl.
CPC ..... *H05K 7/20309* (2013.01); *H05K 7/20327* (2013.01); *H05K 7/20381* (2013.01)
(58) Field of Classification Search
CPC ........... H01L 23/427; F28D 2021/0029; F28D 15/0275; F28D 15/0266; F28D 15/043; F28D 15/02; F28D 15/0233; H05K 7/20336; H05K 7/20309; H05K 7/20318; H05K 7/20327; H05K 7/20781; H05K 7/20272
See application file for complete search history.

(56) References Cited

U.S. PATENT DOCUMENTS

| | | | |
|---|---|---|---|
| 2003/0205363 A1* | 11/2003 | Chu | F28D 15/0266 165/104.33 |
| 2006/0065386 A1* | 3/2006 | Alam | F28D 15/0266 165/104.33 |
| 2009/0101308 A1* | 4/2009 | Hardesty | F28D 15/0266 165/80.4 |
| 2018/0177077 A1* | 6/2018 | Shioga | F28D 15/046 |
| 2019/0206764 A1* | 7/2019 | Kulkarni | H01L 23/433 |
| 2019/0274230 A1* | 9/2019 | North | H05K 7/20309 |

(Continued)

FOREIGN PATENT DOCUMENTS

| CN | 108168342 A | 6/2018 |
|---|---|---|
| CN | 112556468 A | 3/2021 |

(Continued)

*Primary Examiner* — Adam B Dravininkas
(74) *Attorney, Agent, or Firm* — Hershkovitz & Associates, PLLC; Abe Hershkovitz

(57) ABSTRACT

Provided is a heat pipe, which has a simple construction but an excellent heat transfer performance. A loop-type heat pipe (1) has a loop-shaped fluid moving route, in which an evaporation portion (2), a vapor-rich pipe portion (4), a condensation portion (3) and a liquid-rich pipe portion (5) are sequentially connected. A nozzle portion (6) and a diffuser portion (7) are formed in that loop-shaped fluid moving route. As a result, a difference is made between the forward fluid resistance and the backward fluid resistance of the loop-shaped fluid moving route, thereby to form a one-directional steam flow in the loop-shaped fluid moving route.

16 Claims, 9 Drawing Sheets

(56) References Cited

U.S. PATENT DOCUMENTS

2020/0011610 A1\* 1/2020 Wang .................... F28F 9/0263
2020/0328137 A1\* 10/2020 Lan ..................... F28D 15/0266

FOREIGN PATENT DOCUMENTS

| CN | 113251837 A | 8/2021 |
| CN | 114485238 A | 5/2022 |
| WO | 2009051001 A1 | 4/2009 |

\* cited by examiner

HEAT DISSIPATING DEVICE

BACKGROUND OF THE INVENTION

1. Field of the Invention

The present invention relates to a heat dissipating assembly, especially to a heat dissipating device that has a passive one-way valve structure.

2. Description of the Prior Arts

With the development of technology, the working efficiency of the electronic components is further improved. As the performance of electronic components increases, the heat generated by the electronic components also increases, so high-performance electronic components need to be equipped with heat sinks that have higher heat dissipation efficiency, such as a roll-bond evaporator. A conventional roll-bond evaporator has a thermal board and a cycling channel formed in the thermal board and filled with cooling liquid. When the roll-bond evaporator is in thermal contact with heating electronic components, the cooling liquid in the cycling channel absorbs the heat of the electronic components and performs phase changing, and then cycles in the cycling channel to cool down, thereby cooling down electronic components.

However, in the conventional roll-bond evaporator, the cooling liquid in the cycling channel is affected by gravity, such that the cooling liquid tends to flow in the lower section of the cycling channel but rarely flows to the higher section of the cycling channel, and therefore the cooling liquid cannot cool down the higher section of the cycling channel and leads to uneven heat dissipation of the higher section and the lower section of the cycling channel, which seriously affects the performance of electronic components and causes damage to the electronic components.

To overcome the shortcomings, the present invention provides a heat dissipating device to mitigate or obviate the aforementioned problems.

SUMMARY OF THE INVENTION

The main objective of the present invention is to provide a heat dissipating device that has a cycling channel with a passive one-way valve structure, so after the working fluid evaporates, the working fluid can cycle in the cycling channel in a single direction through the higher section and the lower section of the cycling channel, so as to effectively dissipate heat.

The heat dissipating device has a thermal board and a cycling channel. The thermal board is a board and has a heat-absorbing edge and a condensation edge. The cycling channel is a passage annularly formed in the thermal board, is configured to be filled with a working fluid, and has at least one passive one-way valve section. Each of the at least one passive one-way valve section is adjacent to the heat-absorbing edge. The working fluid absorbs heat to cause phase changing on part of the working fluid to flow in a single direction in the cycling channel through each of the at least one passive one-way valve section.

By forming the passive one-way valve section in the cycling channel, the working fluid (liquid or gas) is restricted to flow in a same and single direction in the cycling channel, so the working fluid can flow against gravity to effectively cycle and cool down in the cycling channel, which significantly increases the cooling effect.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
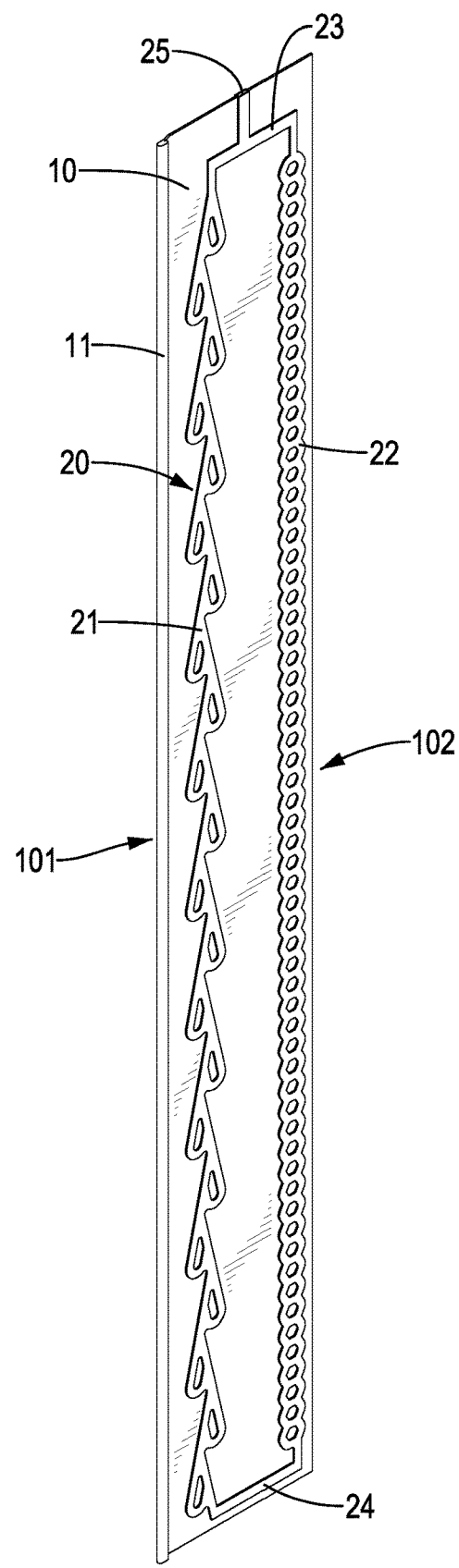
FIG. 1 is a perspective view of a first embodiment of a heat dissipating device in accordance with the present invention.
Figure 2:
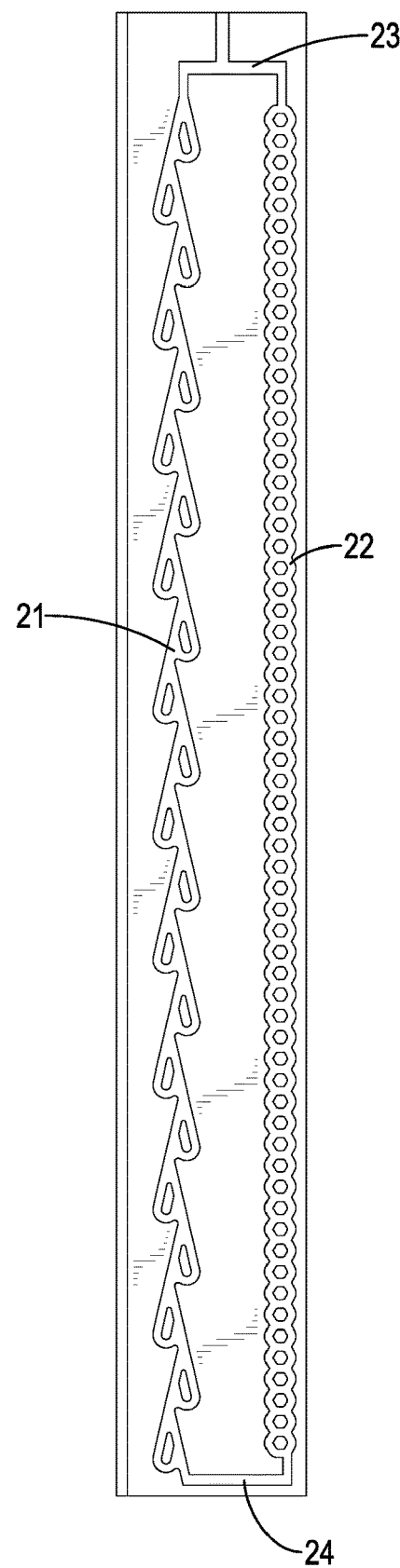
FIG. 2 is a side view of the heat dissipating device in FIG. 1.

With reference to FIGS. 1 and 2, a first embodiment of the heat dissipation device in accordance with the present invention has a thermal board 10 and a cycling channel 20. The thermal board 10 is a board. The cycling channel 20 is formed inside the thermal board 10. As shown in the drawings, the cycling channel 20 is formed in a surface of the thermal board 10 having a larger surface area. Two opposite edges of the thermal board 10 are respectively a heat-absorbing edge 101 and a condensation edge 102.

The cycling channel 20 has multiple sections connected to each other. The sections comprise at least one passive one-way valve section 21. The passive one-way valve section 21 is adjacent to the heat-absorbing edge 101. The passive one-way valve section 21 is a channel with a tesla valve structure. The thermal board 10 has a liquid inlet 25 connected to the cycling channel 20. A working fluid is filled into the cycling channel 20 through the liquid inlet 25. The liquid inlet 25 is sealed after the filling process of the working fluid is accomplished. After the working fluid absorbs heat to cause phase changing on a portion of the working fluid, the working fluid cycles in the cycling channel 20 along a single direction by the work of the passive one-way valve section 21.

In the first embodiment, the sections of the cycling channel 20 further has a first connecting section 23, at least one geometric section 22, and a second connecting section 24. The first connecting section 23, each of the at least one geometric section 22, the second connecting section 24, and the passive one-way valve section 21 are sequentially connected to each other. The geometric section 22 is adjacent to the condensation edge 10. Specifically, an end of the first connecting section 23 is connected to an end of each of the at least one passive one-way valve section 21. Another end of the first connecting section 23 is connected to an end of each of the at least one geometric section 22. An end of the second connecting section 24 is connected to another end of each of the at least one passive one-way valve section 21. Another end of the second connecting section 24 is connected to another end of each of the at least one geometric section 222.

Figure 3:
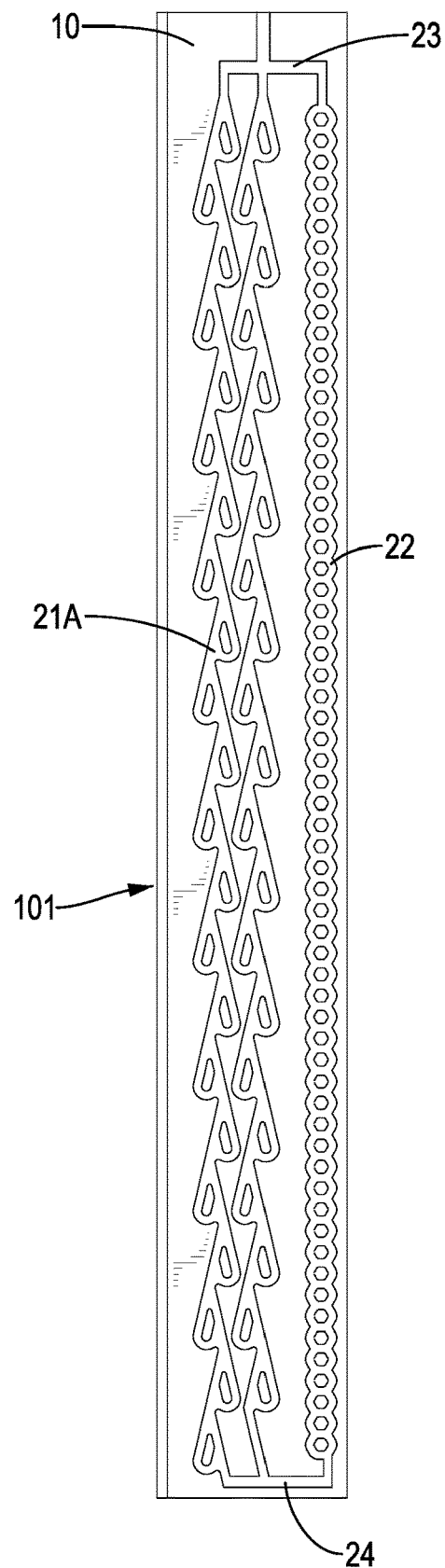
FIG. 3 is a side view of a second embodiment of a heat dissipating device in accordance with the present invention.

With reference to FIG. 3, in a second embodiment of the heat dissipation device in accordance with the present invention, the configurations and structures of the sections of the cycling channel 20 are basically the same as in the first embodiment. The difference between the second embodiment and the first embodiment is that a number of the at least one passive one-way valve section 21A is two. The two passive one-way valve sections 21A are arranged side by side and are adjacent to the heat-absorbing edge 101. The first connecting section 23 is connected to an end of each of the two passive one-way valve sections 21A. The second connecting section 24 is connected to another end of each of the two passive one-way valve sections 21A.

Figure 4:
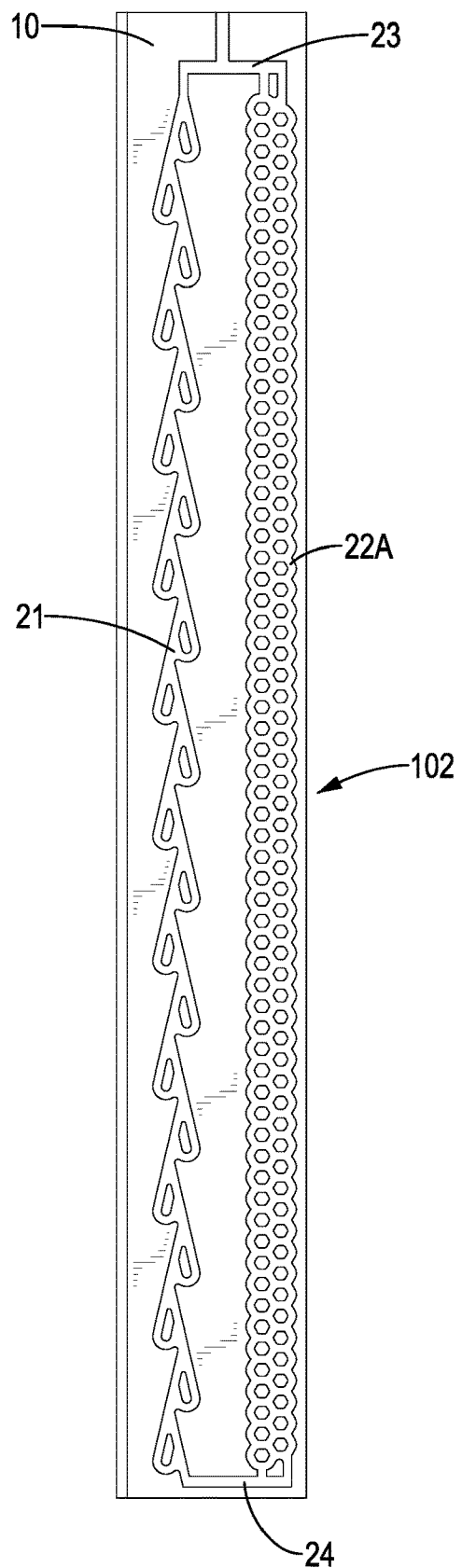
FIG. 4 is a side view of a third embodiment of a heat dissipating device in accordance with the present invention.

With reference to FIG. 4, in a third embodiment of the heat dissipation device in accordance with the present invention, the configurations and structures of the sections of the cycling channel 20 are basically the same as in the first embodiment. The difference between the second embodiment and the first embodiment is that a number of the at least one geometric section 22A is two. The two geometric sections 22A are arranged side by side and are adjacent to the condensation edge 102. The first connecting section 23 is connected to an end of each of the two geometric sections 22A. The second connecting section 24 is connected to another end of each of the two geometric sections 22A.

Figure 5:
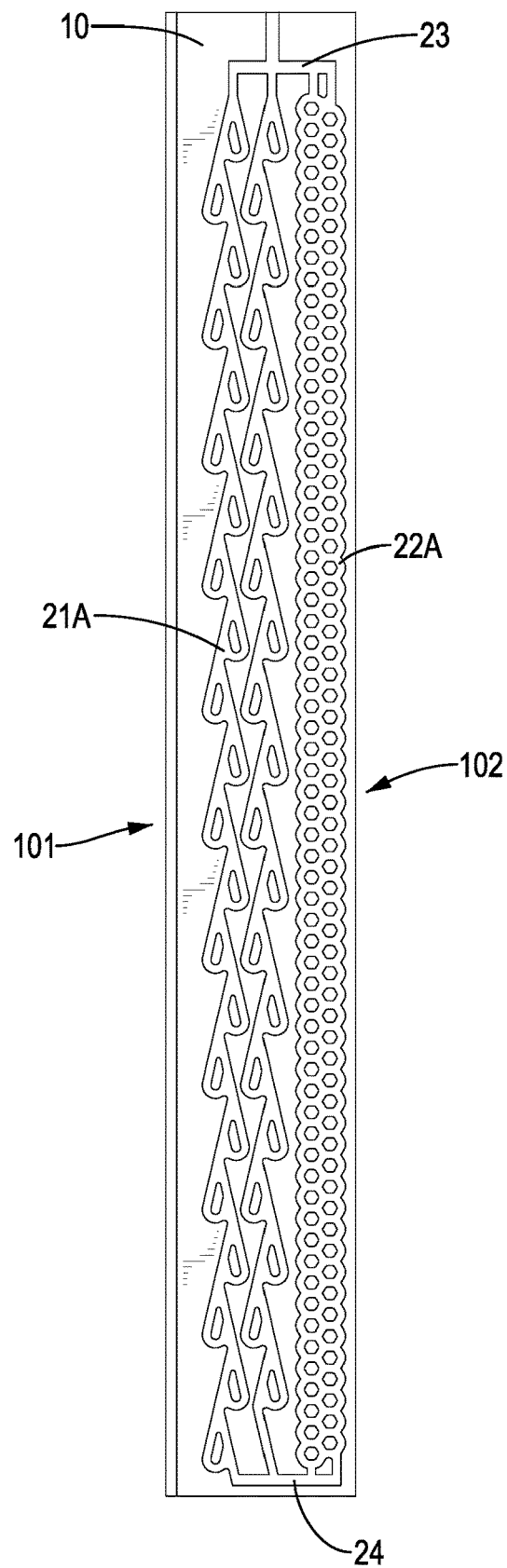
FIG. 5 is a side view of a fourth embodiment of a heat dissipating device in accordance with the present invention.

With reference to FIG. 5, in a third embodiment of the heat dissipation device in accordance with the present invention, the configurations and structures of the sections of the cycling channel 20 are basically the same as in the first embodiment. The difference between the second embodiment and the first embodiment is that a number of the at least one passive one-way valve section 21A is two and a number of the at least one geometric section 22A is two. The two passive one-way valve sections 21A are arranged side by side and are adjacent to the heat-absorbing edge 101. The two geometric sections 22A are arranged side by side and are adjacent to the condensation edge 102. An end of the first connecting section 23 is connected to an end of each of the two passive one-way valve sections 21A. An end of the second connecting section 24 is connected to another end of each of the two passive one-way valve sections 21A. Another end of the first connecting section 23 is connected to an end of each of the two geometric sections 22A. Another end of the second connecting section 24 is connected to another end of each of the two geometric sections 22A.

Figure 6:
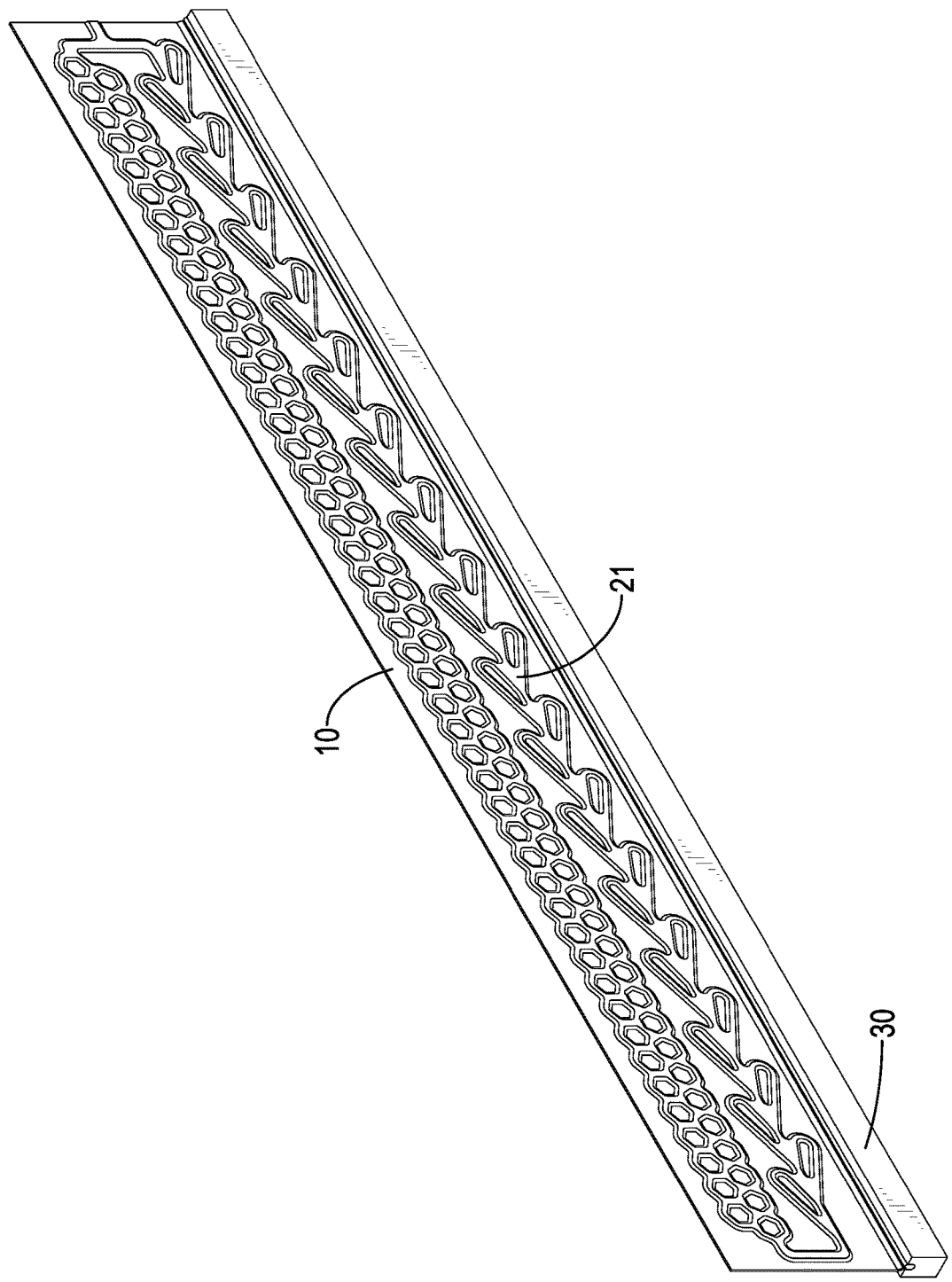
FIG. 6 is a perspective view of a fifth embodiment of a heat dissipating device in accordance with the present invention.
Figure 7:
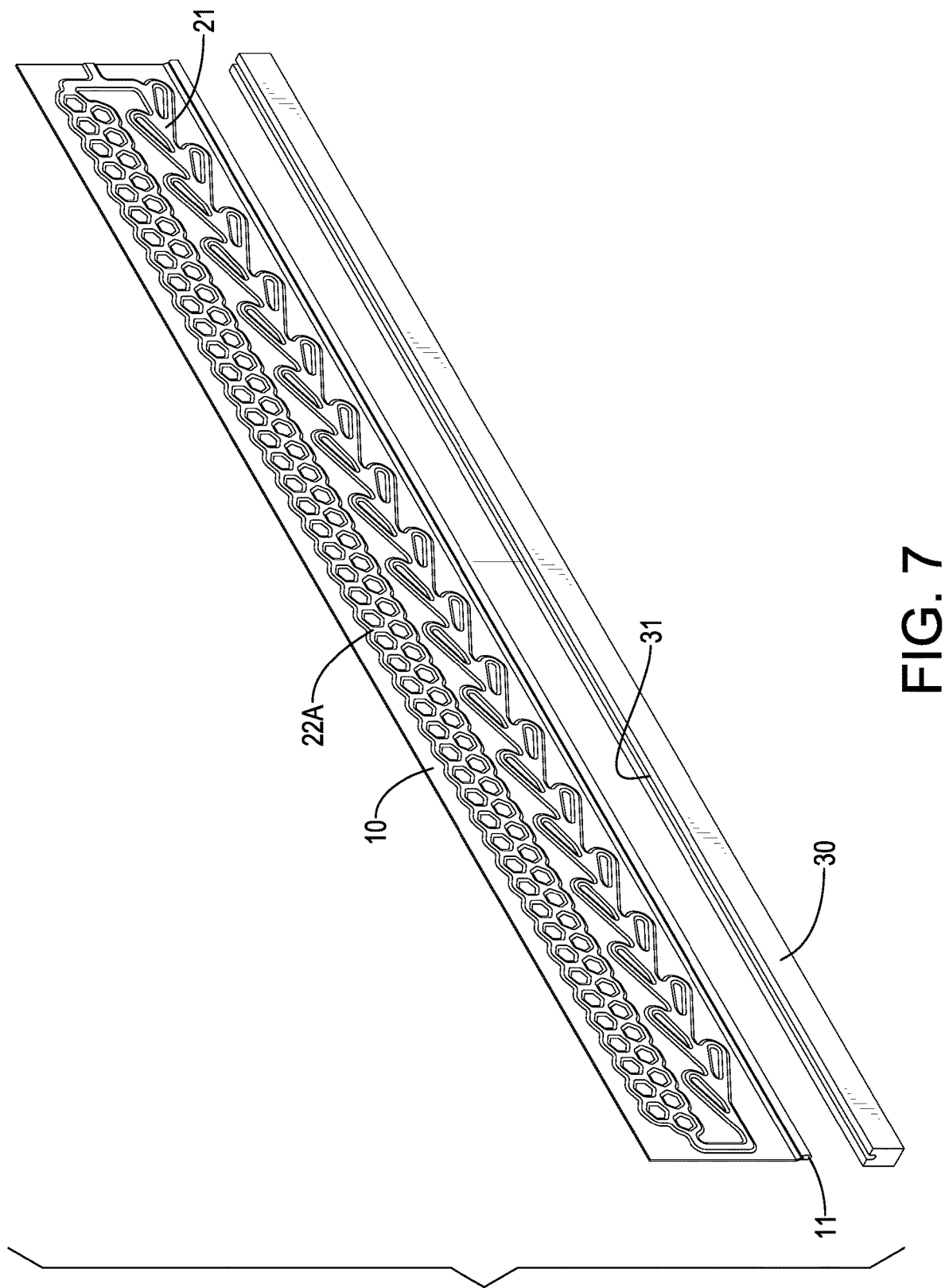
FIG. 7 is an exploded view of the heat dissipating device in FIG. 6.
Figure 8:
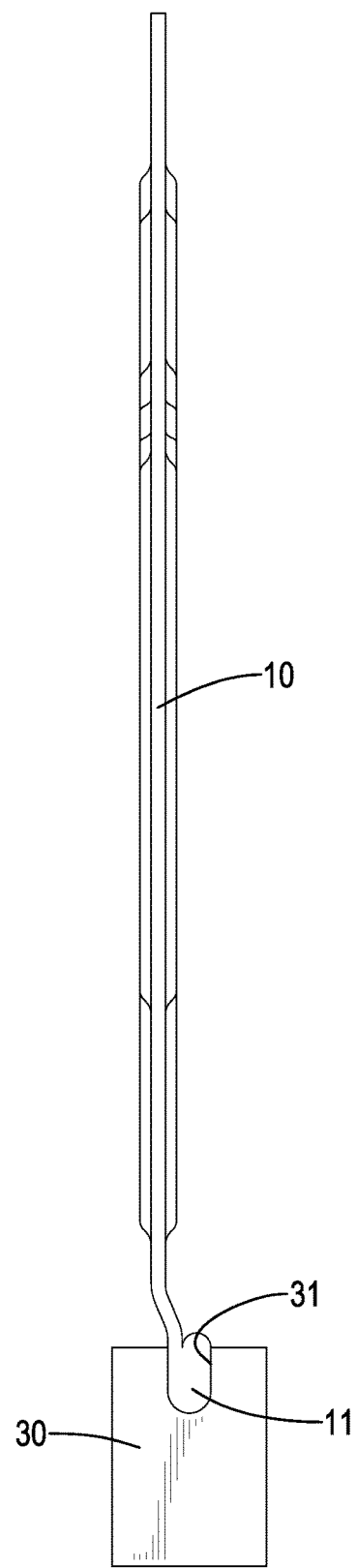
FIG. 8 is an end view of the heat dissipating device in FIG. 6, showing the combination.

With reference to FIGS. 6, 7, and 8, a fifth embodiment of the heat dissipation device in accordance with the present invention has a thermal base 30 made of materials with high thermal conductivity such as aluminum, but not limited thereto.

The thermal base 30 can be an elongated component. The thermal base 30 has an assembling groove 31 formed inward on a surface. The thermal board 10 can be an elongated board and has an assembling rib 11 protruding from the heat-absorbing edge 101. The assembling rib 11 is assembled in the assembling groove 31 to achieve a better thermal conductivity.

Figure 9:
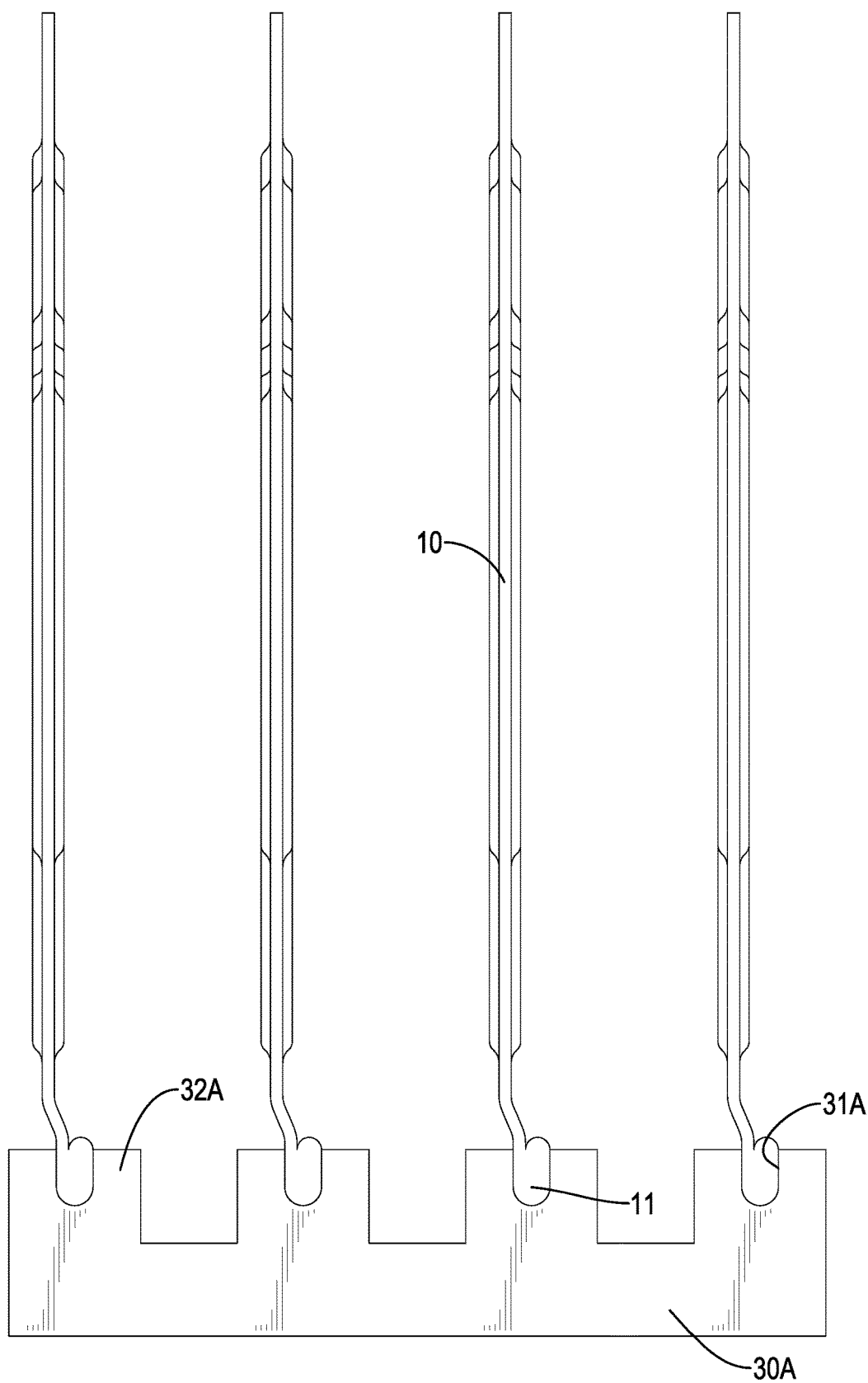
FIG. 9 is an end view of a sixth embodiment of a heat dissipating device in accordance with the present invention.

With reference to FIG. 9, in a sixth embodiment, the thermal base 30A is different to the thermal base 30 in the fifth embodiment. The thermal base 30A is a thick board. The thermal base 30A has at least one assembling groove 31A formed inward. The thermal base 30A has multiple protrusions 32A spaced apart from each other. Each of the protrusions 32A forms an assembling groove 31A. The assembling rib 11 of the thermal board 10 is assembled with the assembling groove 31A. The thermal base 30A is assembled with a plurality of the thermal boards 10.

The geometric section 22 is a hexagonal channel structure in the aforementioned embodiments, but the geometric section 22 can also be shaped as a circle, a rhombic, a triangle, or a polygon in other embodiments.

When in use, the present invention thermally contacts the heat source such as a CPU with the thermal board 10 or the thermal base 30,30A, and the working fluid is implemented as a coolant. After the thermal board 10 thermally contacts the heat source, the working fluid in the cycling channel 20 will be heated and evaporate, so the working fluid (including gas and liquid) flows through the tesla valve structure of the passive one-way valve section 21 along a single direction by the work of pressure. Therefore, the working fluid can be forced to flow to the higher area of the geometric section 22 without being affected by gravity, thereby effectively improving the heat dissipating performance.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipating device comprising:
   a thermal board having
      a heat-absorbing edge; and
      a condensation edge;
   a cycling channel being a passage annularly formed in the thermal board, configured to be filled with a working fluid, and having
      at least one passive one-way valve section; each of the at least one passive one-way valve section being adjacent to the heat-absorbing edge; the working fluid absorbing heat to cause phase changing on part of the working fluid to flow in a single direction in the cycling channel through each of the at least one passive one-way valve section; and
   a thermal base having
      at least one assembling groove formed inwardly; each of the at least one assembling groove being configured to install the thermal board;
   wherein the thermal board has
      an assembling rib protruding from the heat-absorbing edge and mounted in the at least one assembling groove.

2. The heat dissipating device as claimed in claim 1, wherein the at least one passive one-way valve section is a channel with a tesla valve structure.

3. The heat dissipating device as claimed in claim 2, wherein the cycling channel has a first connecting section, at least one geometric section, and a second connecting section;
   the first connecting section, the at least one passive one-way valve section, the second connecting section, and the at least one geometric section are sequentially connected to each other;
   each of the at least one geometric section is adjacent to the condensation edge;
   an end of the first connecting section is connected to an end of each of the at least one passive one-way valve section; another end of the first connecting section is connected to an end of each of the at least one geometric section;

an end of the second connecting section is connected to another end of each of the at least one passive one-way valve section; another end of the second connecting section is connected to another end of each of the at least one geometric section.

4. The heat dissipating device as claimed in claim 3, wherein the thermal board has a liquid inlet connected to the cycling channel.

5. The heat dissipating device as claimed in claim 4, wherein a number of the at least one passive one-way valve section is two; the two passive one-way valve sections are parallel and are located next to each other; a number of the at least one geometric section is one.

6. The heat dissipating device as claimed in claim 5, wherein the at least one geometric section is each shaped as a hexagon, a circle, a diamond, a triangle, or a polygon.

7. The heat dissipating device as claimed in claim 4, wherein a number of the at least one passive one-way valve section is one; a number of the at least one geometric section is two; the two geometric sections are parallel to each other and are arranged next to each other.

8. The heat dissipating device as claimed in claim 7, wherein the at least one geometric section is each shaped as a hexagon, a circle, a diamond, a triangle, or a polygon.

9. The heat dissipating device as claimed in claim 4, wherein a number of the at least one passive one-way valve section is two; the two passive one-way valve sections are parallel to each other and are arranged next to each other; a number of the at least one geometric section is two; the two geometric sections are parallel to each other and are arranged next to each other.

10. The heat dissipating device as claimed in claim 9, wherein the at least one geometric section is each shaped as a hexagon, a circle, a diamond, a triangle, or a polygon.

11. The heat dissipating device as claimed in claim 1, wherein the cycling channel has a first connecting section, at least one geometric section, and a second connecting section;

the first connecting section, the at least one passive one-way valve section, the second connecting section, and the at least one geometric section are sequentially connected to each other;

each of the at least one geometric section is adjacent to the condensation edge;

an end of the first connecting section is connected to an end of each of the at least one passive one-way valve section; another end of the first connecting section is connected to an end of each of the at least one geometric section;

an end of the second connecting section is connected to another end of each of the at least one passive one-way valve section; another end of the second connecting section is connected to another end of each of the at least one geometric section.

12. The heat dissipating device as claimed in claim 11, wherein a number of the at least one passive one-way valve section is two; the two passive one-way valve sections are parallel and are located next to each other; a number of the at least one geometric section is one.

13. The heat dissipating device as claimed in claim 11, wherein the at least one geometric section is each shaped as a hexagon, a circle, a diamond, a triangle, or a polygon.

14. The heat dissipating device as claimed in claim 1, wherein the thermal board has a liquid inlet connected to the cycling channel.

15. A heat dissipating device comprising:
a thermal board having a heat-absorbing edge and a condensation edge;
a cycling channel being a passage annularly formed in the thermal board, configured to be filled with a working fluid, and having at least one passive one-way valve section;
each of the at least one passive one-way valve section being adjacent to the heat-absorbing edge;
the working fluid absorbing heat to cause phase changing on part of the working fluid to flow in a single direction in the cycling channel through each of the at least one passive one-way valve section;
wherein the cycling channel has a first connecting section, at least one geometric section, and a second connecting section;
the first connecting section, the at least one passive one-way valve section, the second connecting section, and the at least one geometric section are sequentially connected to each other;
each of the at least one geometric section is adjacent to the condensation edge;
an end of the first connecting section is connected to an end of each of the at least one passive one-way valve section; another end of the first connecting section is connected to an end of each of the at least one geometric section;
an end of the second connecting section is connected to another end of each of the at least one passive one-way valve section; another end of the second connecting section is connected to another end of each of the at least one geometric section; and
wherein a number of the at least one passive one-way valve section is one; a number of the at least one geometric section is two; the two geometric sections are parallel to each other and are arranged next to each other.

16. A heat dissipating device comprising:
a thermal board having
a heat-absorbing edge; and
a condensation edge;
a cycling channel being a passage annularly formed in the thermal board, configured to be filled with a working fluid, and having
at least one passive one-way valve section; each of the at least one passive one-way valve section being adjacent to the heat-absorbing edge; the working fluid absorbing heat to cause phase changing on part of the working fluid to flow in a single direction in the cycling channel through each of the at least one passive one-way valve section;
wherein the cycling channel has a first connecting section, at least one geometric section, and a second connecting section;
the first connecting section, the at least one passive one-way valve section, the second connecting section, and the at least one geometric section are sequentially connected to each other;
each of the at least one geometric section is adjacent to the condensation edge;
an end of the first connecting section is connected to an end of each of the at least one passive one-way valve section; another end of the first connecting section is connected to an end of each of the at least one geometric section;
an end of the second connecting section is connected to another end of each of the at least one passive one-way valve section; another end of the second connecting section is connected to another end of each of the at least one geometric section; and
wherein a number of the at least one passive one-way valve section is two; the two passive one-way valve sections are parallel to each other and are arranged next to each other; a number of the at least one geometric section is two; the two geometric sections are parallel to each other and are arranged next to each other.

* * * * *